United States Patent
Barns et al.

(10) Patent No.: US 7,144,816 B2
(45) Date of Patent: Dec. 5, 2006

(54) POLYSILICON OPENING POLISH

(75) Inventors: Chris E. Barns, Portland, OR (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 10/799,996

(22) Filed: Mar. 12, 2004

(65) Prior Publication Data

US 2004/0192018 A1 Sep. 30, 2004

Related U.S. Application Data

(63) Continuation of application No. 10/008,683, filed on Dec. 4, 2001, now Pat. No. 6,743,683.

(51) Int. Cl.
*H01L 21/302* (2006.01)

(52) U.S. Cl. ............ 438/692; 438/626; 438/630; 438/691

(58) Field of Classification Search ............ 438/691, 438/692, 693, 197, 296, 265, 626, 6
See application file for complete search history.

(56) References Cited

U.S. PATENT DOCUMENTS

| | | | | |
|---|---|---|---|---|
| 4,740,484 A | * | 4/1988 | Norstrom et al. ............ 437/200 |
| 6,074,921 A | * | 6/2000 | Lin ............................ 438/299 |
| 6,080,655 A | * | 6/2000 | Givens et al. ............... 438/626 |
| 6,171,910 B1 | * | 1/2001 | Hobbs et al. ............... 438/275 |
| 6,194,299 B1 | * | 2/2001 | Buynoski ..................... 438/592 |
| 6,251,778 B1 | * | 6/2001 | Fang et al. .................. 438/682 |
| 2002/0019202 A1 | * | 2/2002 | Thomas et al. .............. 451/57 |
| 2002/0028555 A1 | * | 3/2002 | Boyd et al. .................. 438/299 |

OTHER PUBLICATIONS

Ducroquet et al., "Full CMP Integration . . . ," IEEE Transactions on Electron Devices, 48(8):1816-1821, 2001.
Matsuda et al., "Performance Improvement of Metal . . . ," Symposium on VLSI Technology Digest of Technical Papers, 2001.
Ushiki et al., "Reliable Tatalum-Gate . . . ," IEEE Transactions on Electron Devices, 44(9):1467-1472, 1997.
Yagishita et al., "Improvement of Threshold Voltage . . . ," IEEE Transactions on Electron Devices, 48(8):1604-1611, 2001.
Planar Solutions Announces New Second Step Copper CMP Slurry, Arch SemiConductor Photopolymers: About Us, no date.
Conaghan et al., "Applications of silicides in semiconductor processing," , no date.
Abstract, Cabot Microelectronics Corporation, Semiconductor Products, 2000.
Abstract, Cabot Microelectronics Corporation, FAX (Frequently Asked Questions), 2000.

* cited by examiner

*Primary Examiner*—Lan Vinh
(74) *Attorney, Agent, or Firm*—Fish & Richardson P.C.

(57) ABSTRACT

Fabricating a semiconductor structure includes providing a semiconductor substrate, forming a silicide layer over the substrate, and removing a portion of the silicide layer by chemical mechanical polishing. The fabrication of the structure can also include forming a dielectric layer after forming the silicide layer, and removing a portion of the dielectric layer by chemical mechanical polishing before removing the portion of the silicide layer.

9 Claims, 9 Drawing Sheets

POLYSILICON OPENING POLISH

This application is a continuation of 10/008,683 filed on Dec. 4, 2001 now U.S. Pat. 6,743,683.

TECHNICAL FIELD

This invention relates to semiconductor substrate processing.

BACKGROUND

A metal oxide field effect transistor (MOSFET) can be formed with a polysilicon gate electrode. A polysilicon gate electrode, defined by dry etching, can be used for the formation of self-aligned sources and drains. In use, polysilicon can undergo electron depletion, resulting in a reduction of effective gate thickness and of transistor speed. The polysilicon gate electrode can be removed after source and drain formation, and replaced by a metal electrode with desirable electrical characteristics. A polysilicon, not a metal, gate is formed initially, however, because it is difficult to etch metal with sufficient control of critical dimensions and with sufficient selectivity to an underlying gate oxide. Further, a metal gate electrode with a relatively low melting point would present difficulties during sidewall spacer formation, a high temperature process.

Removing the polysilicon electrode is challenging if a silicide process is used in forming the transistor, thereby resulting in the formation of a silicide layer on the top of the polysilicon electrode. Silicide is hard to etch, and it acts as a barrier to complete removal of polysilicon.

DESCRIPTION

Figure 1:
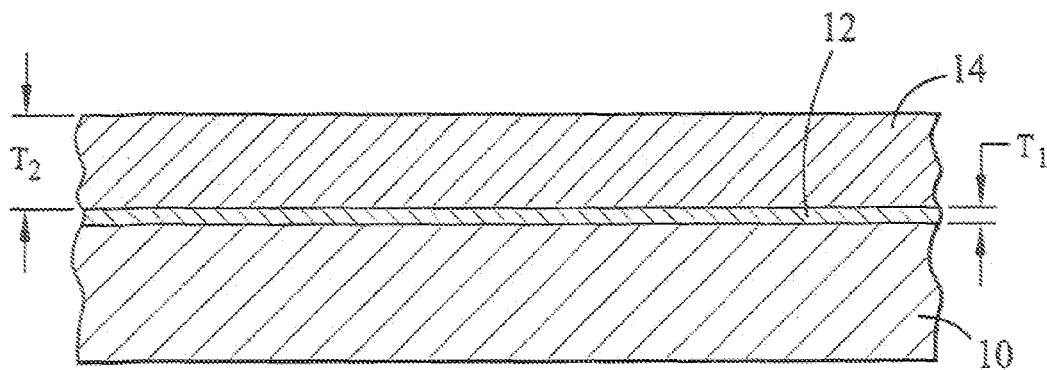
FIGS. 1–16 are cross-sectional views of a semiconductor device structure at various stages of fabrication.

Referring to FIG. 1, a semiconductor substrate 10 has a gate oxide layer 12 and a polysilicon layer 14 deposited thereon. Gate oxide layer 12 has a thickness $T_1$ suitable for use in transistors, e.g., 10–25 Ångstroms (Å), preferably 15 Å. Polysilicon layer 14 has a thickness $T_2$ suitable for a gate electrode in a transistor of, for example, 2600 Å.

Figure 2:
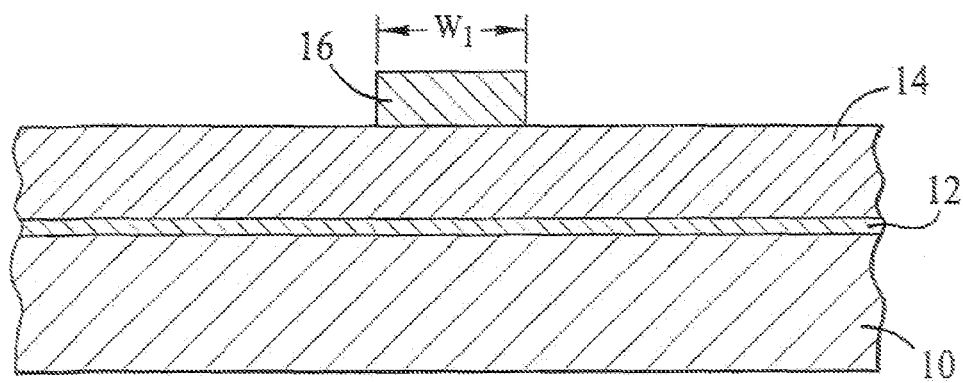

Referring to FIG. 2, a photoresist is dispensed upon polysilicon layer 14 and patterned to form a photoresist masking feature 16. Photoresist masking feature 16 has a width $W_1$ suitable for a transistor channel length, e.g., of 0.03 micrometers (μm).

Figure 3:
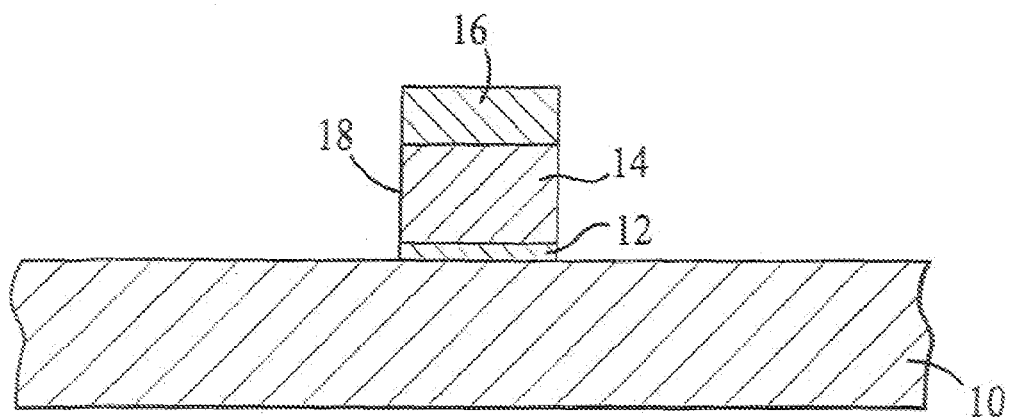

Referring to FIG. 3, portions of polysilicon layer 14 and gate oxide layer 12 are etched by, e.g., dry etching in a high density plasma etching system such as the Silicon Etch DPS II Centura™ 300 system, manufactured by Applied Materials, Inc., Santa Clara, Calif. Portions of polysilicon layer 14 and gate oxide layer 12 not in a shadow of photoresist masking feature 16, i.e. not underneath feature 16, are removed during etching. The etching thereby forms a polysilicon gate electrode 18.

Figure 4:
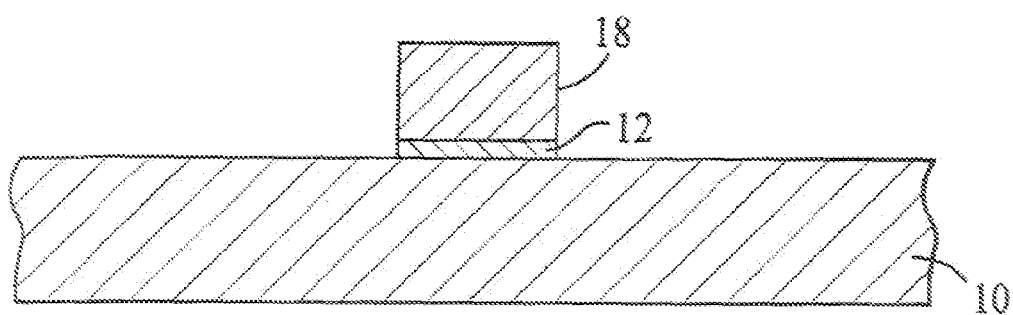

Referring to FIG. 4, photoresist masking feature 16 is stripped off, leaving polysilicon gate electrode 18 and gate oxide 12 on silicon substrate 10.

Figure 5:
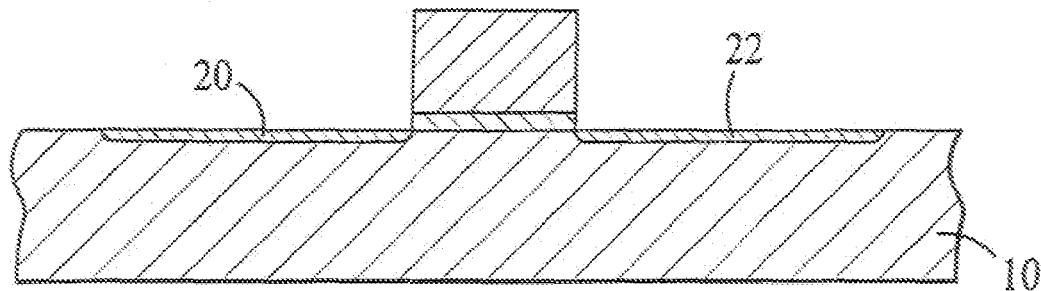

Referring to FIG. 5, a first ion implantation is made into silicon substrate 10 to form a lightly doped source region 20 and a lightly doped drain region 22. For a p-channel device, a p-type dopant, such as boron, may be implanted into lightly doped source 20 and lightly doped drain 22 regions.

Figure 6:
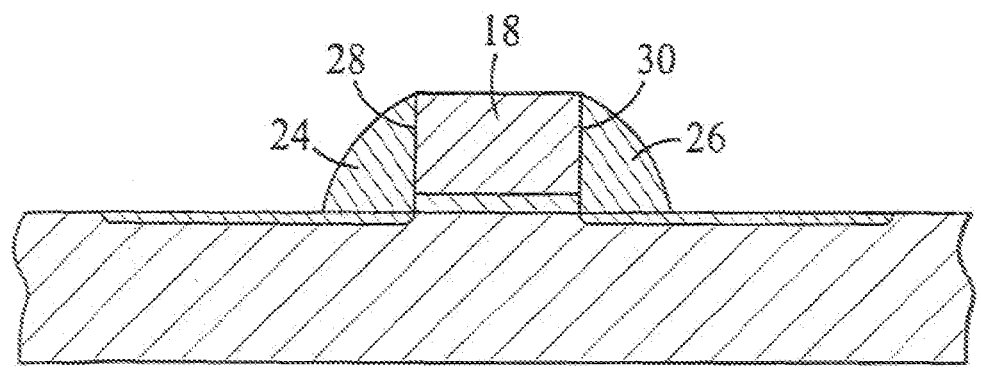

Referring to FIG. 6, a first sidewall spacer 24 and a second sidewall spacer 26 are formed proximate a first side 28 and a second side 30 of polysilicon gate electrode 18, respectively. First and second sidewall spacers 24, 26 are formed by the deposition of, e.g., a silicon dioxide sidewall spacer layer by, for example, low pressure chemical vapor deposition (LPCVD), followed by the deposition of, e.g., a silicon nitride sidewall spacer layer, also by LPCVD. The LPCVD of both the silicon dioxide and silicon nitride sidewall spacer layers is done in a furnace, such as VERTRON®V(S) furnace, manufactured by Kokusai Semiconductor Equipment Corporation, Billerica, Mass. Deposition of sidewall spacer layers is followed by etchback in a dry etching system to define first and second sidewall spacers 24, 26. The dry etching system is, for example, the Unity® with a dipole ring magnet (DRM) plasma source, manufactured by Tokyo Electron, with headquarters in Austin, Tex.

Figure 7:
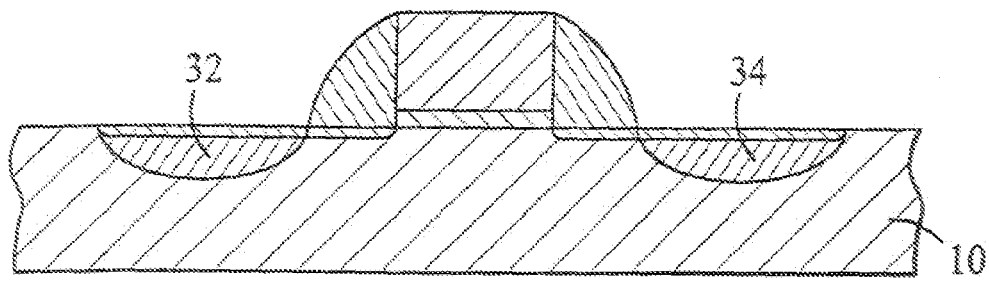

Referring to FIG. 7, a second ion implantation is made into silicon substrate 10 to form a source 32 and a drain 34 region. For a p-channel device, a p-type dopant, such as boron, is implanted into source 32 and drain 34 regions.

Figure 8:
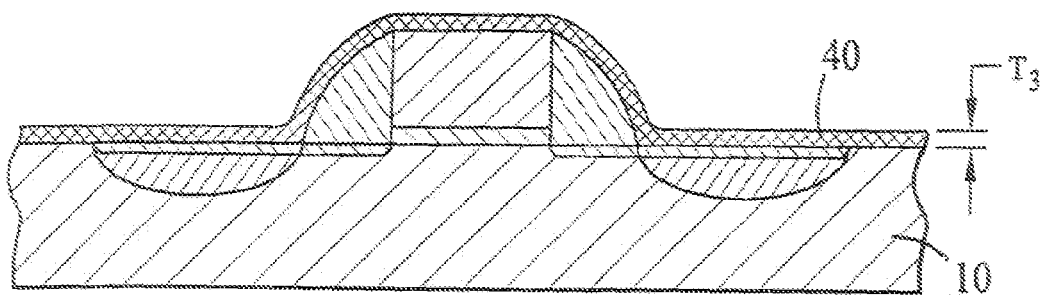
Figure 9:
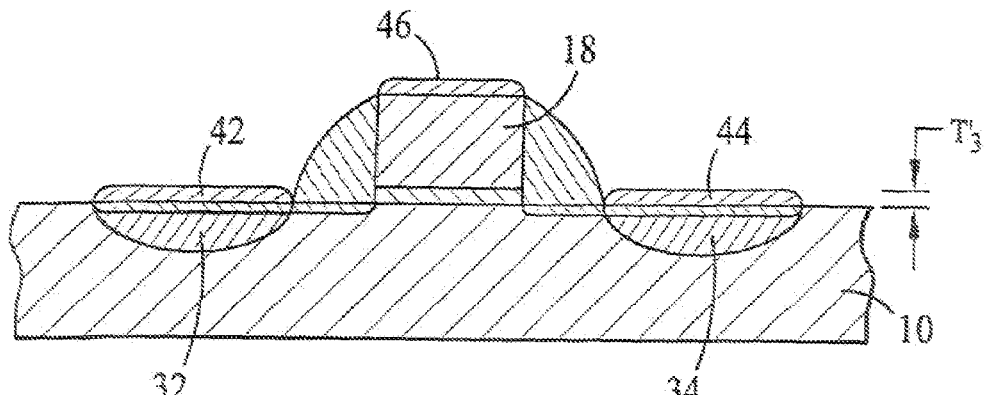

Referring to FIGS. 8 and 9, a metal such as cobalt is deposited over substrate 10 and polysilicon gate electrode 18 to form a cobalt layer 40. Cobalt layer 40 is deposited by a deposition method such as sputtering in a system such as the Endura®, manufactured by Applied Materials, Inc. Cobalt layer 40 has a thickness $T_3$ of, e.g., 200 Å.

Substrate 10 and cobalt layer 40 are heated in, for example, a rapid thermal processing system, such as the RTP XE Centura® system, manufactured by Applied Materials, Inc. At an elevated temperature, such as 700° C., for a short period, such as 45 seconds, cobalt layer 40 reacts with silicon to form a first cobalt silicide region 42 over source 32, a second cobalt silicide region 44 over drain 34, and a third cobalt silicide region 46 over polysilicon gate electrode 18. First, second, and third cobalt silicide regions 42, 44, 46 have a thickness $T_3'$ of 500 Å. Unreacted cobalt, i.e. cobalt which does not react with silicon to form cobalt silicide, over dielectric layers, such as cobalt over first and second sidewall spacers 24, 26, is removed with a wet etch, such as a mixture of sulfuric acid, hydrogen peroxide, and DI water.

Figure 10:
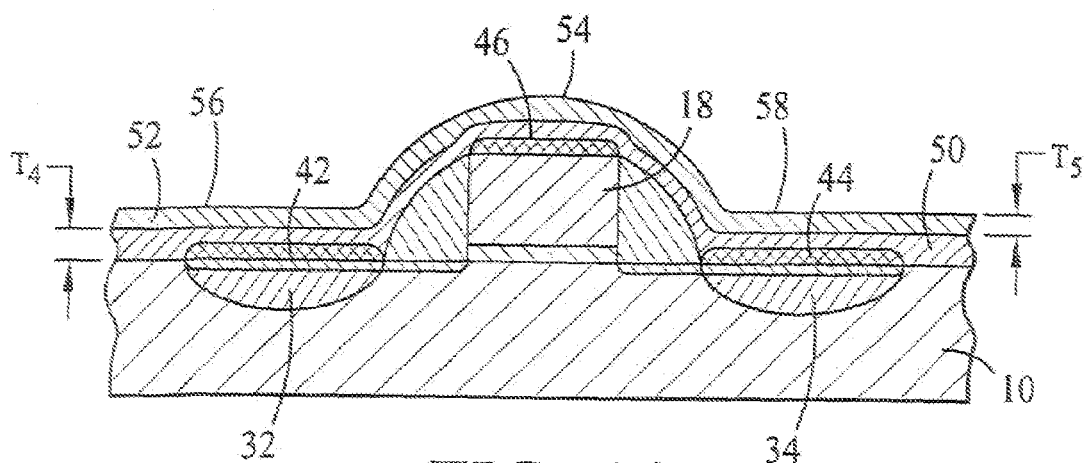

Referring to FIG. 10, silicon nitride is deposited over substrate 10 to form a silicon nitride etch stop layer (NESL) 50. NESL 50 is formed by, e.g., plasma enhanced chemical vapor deposition (PECVD) in a system such as the Producer®, manufactured by Applied Materials, Inc. NESL 50 has a thickness $T_4$ of, e.g., 500 Å, sufficient to serve as an etch stop during a subsequent contact etch. Subsequently, an interlevel dielectric, such as silicon dioxide, is deposited over NESL 50 to form interlevel oxide layer 52. Interlevel oxide layer 52 is formed by a deposition process, for example by PECVD in a system such as the Producer®, manufactured by Applied Materials, Inc. Interlevel oxide layer 52 has a thickness $T_5$ of, for example, approximately twice the height of the polysilicon thickness, e.g. 5000 Å. This thickness $T_5$ is sufficient to provide complete coverage of polysilicon gate electrode 18, without being too thick and thereby wasting material. Nitride layer 50 and interlevel oxide layer 52 follow the topography of the underlying structure, including gate electrode 18 and substrate 10. These layers 50, 52 have, therefore, a high region 54 above gate electrode 18 and a first low region 56 and a second low region 58 above source 32 and drain 34, respectively.

Figure 11:
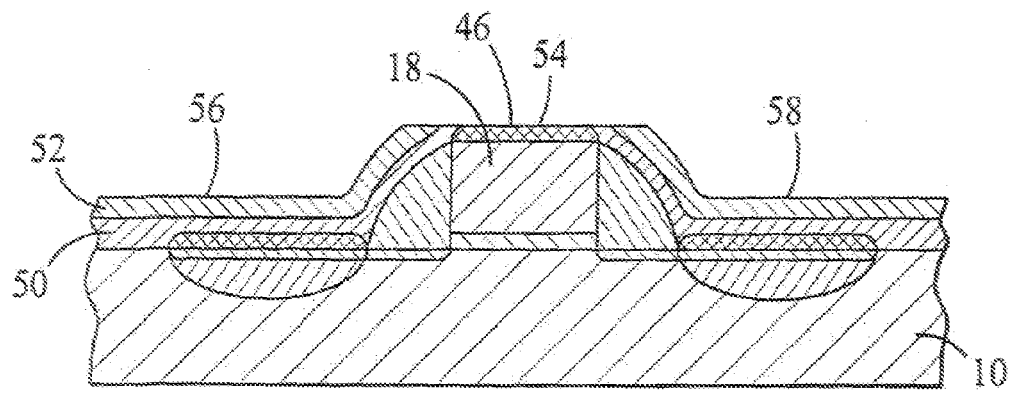

Referring to FIG. 11, silicon substrate 10 is polished in a chemical mechanical polishing. (CMP) system, such as the Reflexion™ system, manufactured by Applied Materials, Inc. The CMP system removes high region 54 of interlevel oxide layer 52 and nitride layer 50, leaving behind first and second low regions 56, 58 of interlevel oxide 52 and nitride 50 layers over source 32 and drain 34, respectively. Interlevel oxide layer 52 and nitride layer 50 left behind in low regions 56, 58 serve as a mask for protecting underlying features. The removal of high region 54 of interlevel oxide 52 and nitride 50 layers results in the exposure of cobalt silicide region 46 over gate electrode 18.

Figure 12:
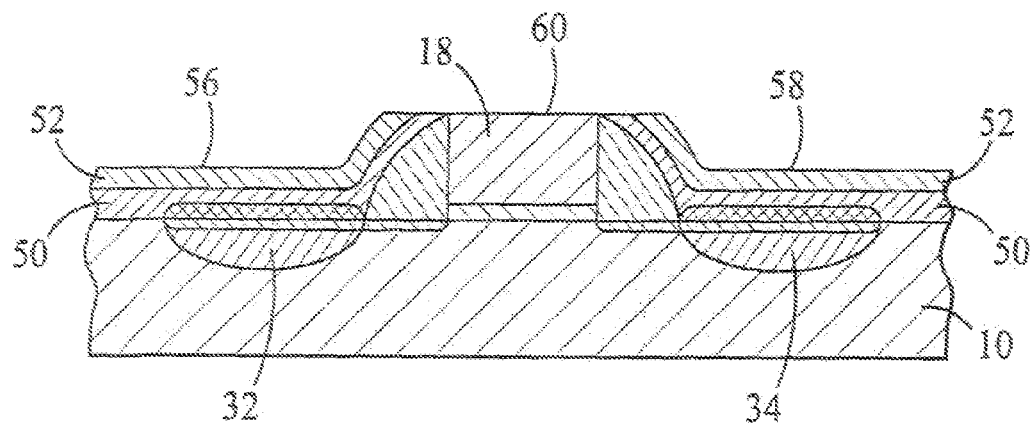

Referring also to FIG. 12, chemical mechanical polishing is continued to remove cobalt silicide region 46 from a top surface 60 of polysilicon gate electrode 18. The chemical mechanical polishing is performed with a slurry providing a relatively low polishing rate for polysilicon 18, a relatively high rate for interlevel silicon dioxide 52, and a sufficiently high polishing rate for silicon nitride 50 and cobalt silicide 46 to achieve the structure illustrated in FIG. 12. The ratio of polishing rates of polysilicon: silicon dioxide: silicon nitride: cobalt silicide is 1:10:7:7 in this embodiment. Cobalt silicide region 46 is removed from gate electrode 18, while interlevel oxide layer 52 and nitride layer 50 in low regions 56, 58 over source 32 and drain 34 are left intact. An example of a suitable slurry that provides the necessary polishing rate selectivities is Semi-Sperse® 10 manufactured by Cabot Microelectronics, based in Aurora, Ill. During polishing, this slurry is diluted to 25% slurry/75% DI water by the addition of DI water to the slurry in the slurry distribution system.

Figure 13:
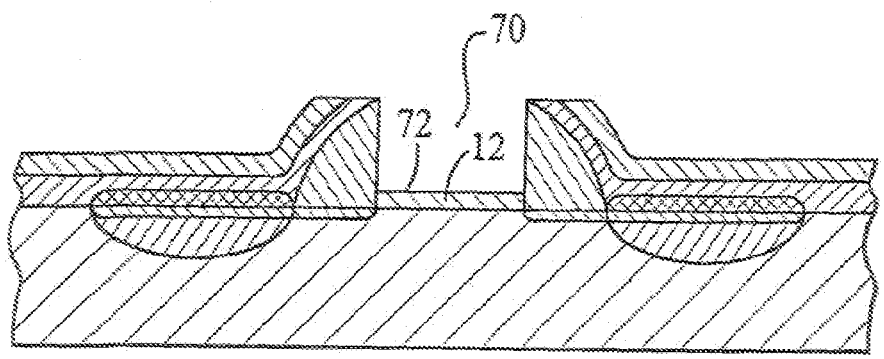

Referring also to FIG. 13, after the removal of cobalt silicide 46 over gate electrode 18, gate electrode 18 is removed by a wet etch, e.g., by ammonium hydroxide, or by a dry etch with, e.g. hydrogen bromide/chlorine/oxygen, leaving a cavity 70 and exposing a top surface 72 of gate oxide layer 12. The wet etch or dry etch is highly selective to gate oxide. Gate oxide layer 12 may be damaged by deposition and removal of polysilicon.

Figure 14:
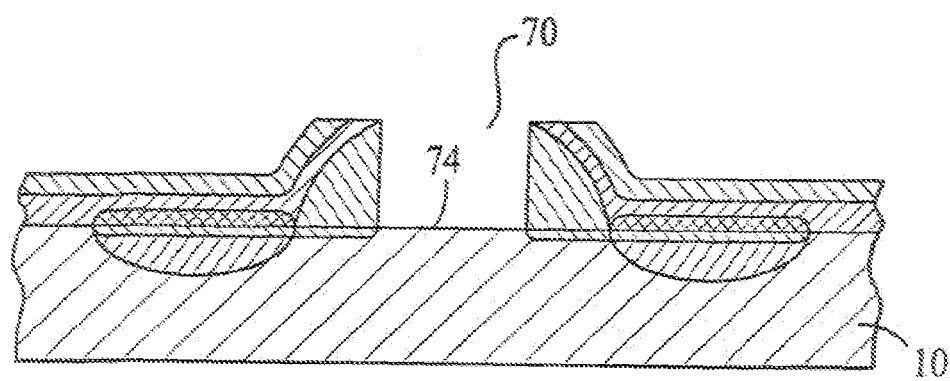

Referring also to FIG. 14, gate oxide layer 12 is removed by a wet etch, such as a solution of hydrofluoric acid, thereby exposing a surface 74 of substrate 10.

Figure 15:
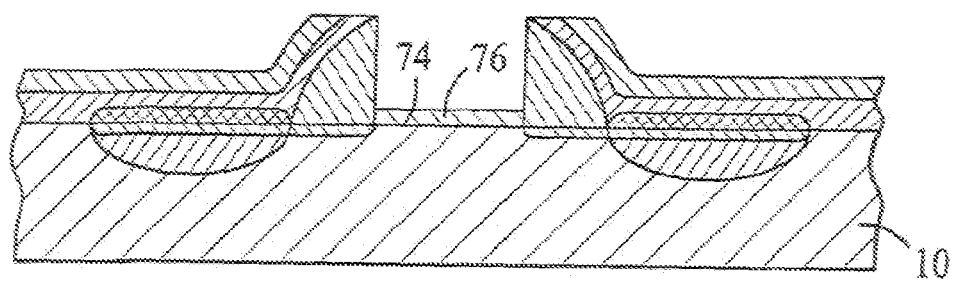

Referring to FIG. 15, a replacement gate oxide layer 76 is grown on surface 74 of substrate 10 to replace damaged gate oxide layer 12.

Figure 16:
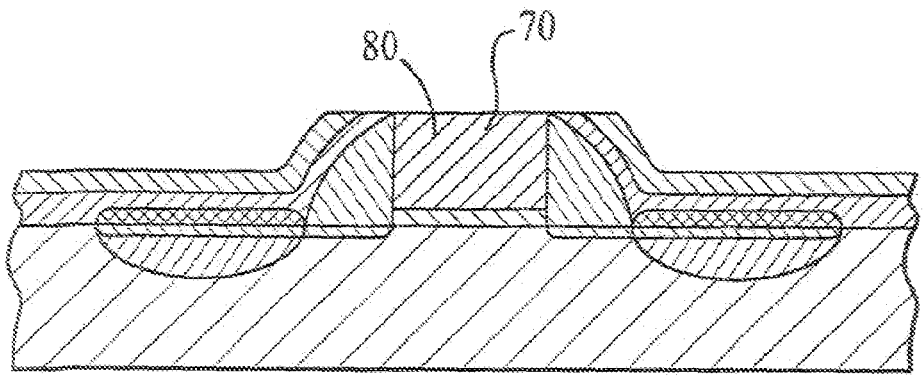

Referring to FIG. 16, a metal is deposited into cavity 70 to form a metal gate electrode 80. The metal is selected to have an appropriate work function for the voltage level at which a transistor, including source 32, drain 34, and gate electrode 80, turns on and off. The metal forming metal gate electrode 80 is, for example, aluminum for an n-channel transistor.

Figure 17:
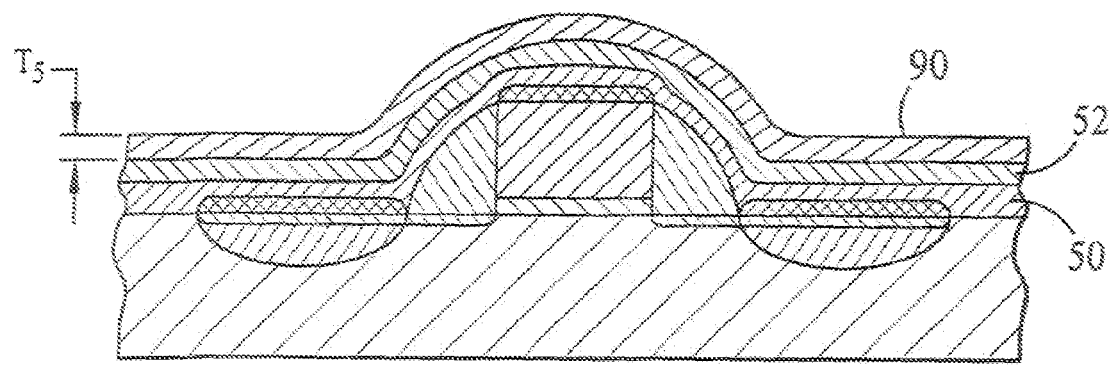
FIGS. 17–19 are cross-sectional views of the semiconductor device structure at alternative stages of fabrication.

Referring to FIG. 17, in a second embodiment, semiconductor substrate 10 is processed as described above with reference to FIG. 1 through FIG. 10. After the deposition of NESL layer 50 and interlevel oxide layer 52, a material is deposited to form top layer 90 on top of interlevel oxide layer 52 and NESL 50. Top layer 90 has a chemical structure different from that of interlevel oxide layer 52. An example of a material suitable for deposition as top layer 90 is a material with a substantially different chemical-mechanical polishing rate from that of the underlying interlevel oxide layer 52, e.g., titanium nitride. Top layer 90 has a thickness $T_5$ of, e.g., 3000 Å.

Figure 18:
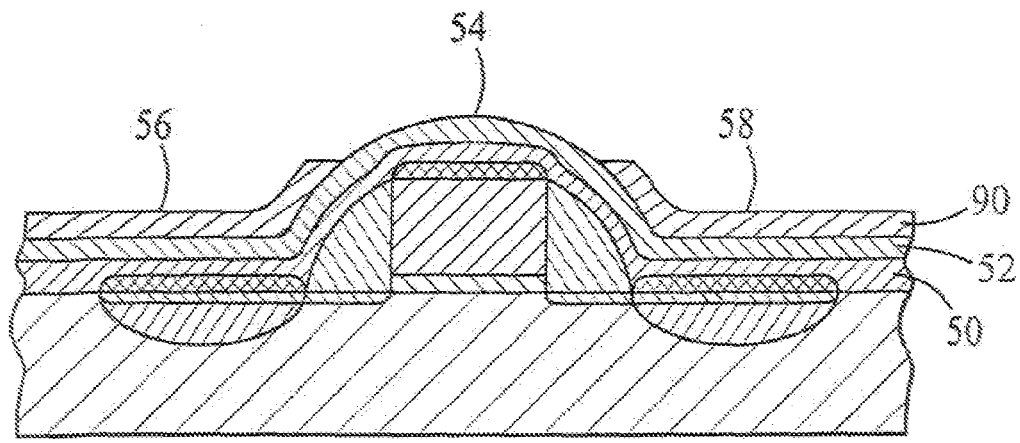

Referring to FIG. 18, top layer 90 is polished in a CMP system, such as the Reflexion®, manufactured by Applied Materials, Inc. Top layer 90 is polished faster than interlevel oxide layer 52 when a first slurry is used, i.e. the polishing rate of top layer 90, comprising titanium nitride, is greater than the polishing rate of the dielectric layer including interlevel oxide layer 52. An example of a suitable first slurry is Semi-Sperse® W2000, manufactured by Cabot Microelectronics. As a result, top layer 90 is removed from high region 54, exposing interlevel oxide 52 in high region 54. Top layer 90 remains as a mask in low regions 56, 58.

Figure 19:
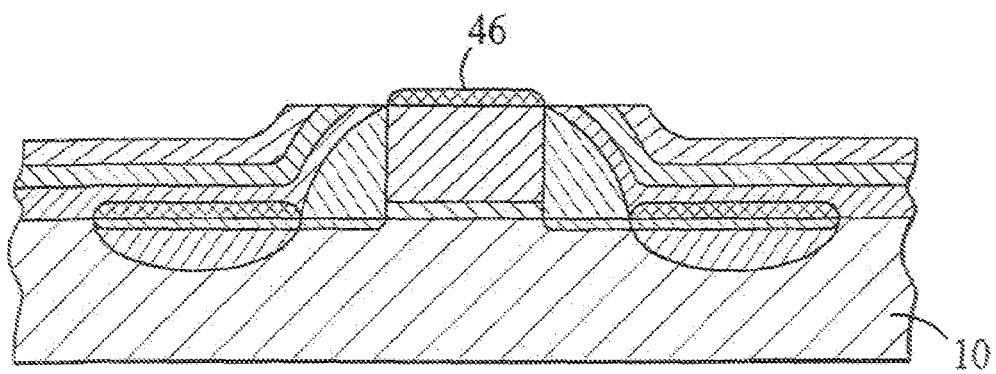

Referring to FIG. 19, a chemical mechanical polish is performed with a second slurry that causes top layer 90 to be polished more slowly than interlevel oxide layer 52 and NESL 50, i.e. the polishing rate of titanium nitride with the second slurry is less than the polishing rate of the dielectric layer comprising interlevel oxide layer 52 and NESL 50. An example of the second slurry is Semi-Sperse® 10, manufactured by Cabot Microelectronics. Hence, the selectivity of the polishing of top layer 90 to interlevel oxide layer 52 is controlled. The CMP with the second slurry results in the exposure of cobalt silicide region 46.

Cobalt silicide region 46 is then removed as described above with reference to FIG. 12, and substrate 10 is processed according to the method described with reference to FIGS. 13–16.

The invention is not limited to the specific embodiments described above. For example, an embodiment of the method can include the formation of an n-channel device, in which an n-type dopant, such as phosphorus, is implanted into the source and drain regions. The nitride etch stop layer can be omitted. The silicon dioxide layer can be doped. The polysilicon gate electrode can be etched out to form a cavity by a dry etch. The silicide layer can include a metal other than cobalt, such as titanium. The silicide layer can be formed by various methods, including by cosputtering a metal and silicon.

After removal of the polysilicon gate electrode and gate oxide, the gate oxide can be removed and replaced with a material with a high dielectric constant. After removal of the polysilicon gate electrode, removal of the gate oxide can be omitted, especially if, e.g., it is not damaged during the removal of the polysilicon, and a metal gate electrode can be formed on the original gate oxide. A barrier layer can be formed between the gate oxide and the metal gate electrode, such as a titanium nitride layer. The metal gate electrode can include metals or metal alloys other than aluminum, such as titanium, aluminum or ruthenium.

Other embodiments not described herein are also within the scope of the following claims.

What is claimed is:

1. A method for fabricating a semiconductor structure, comprising:
   depositing a polysilicon layer on the semiconductor substrate;
   removing a portion of the polysilicon layer to form a high region and a low region;
   forming a suicide layer over the semiconductor substrate;
   selecting chemical mechanical polishing parameters to remove the silicide layer at a first rate and to remove the polysilicon layer at a second rate, where the first rate is higher than the second rate;
   removing a portion of the suicide layer by chemical mechanical polishing at the first rate;
   forming a dielectric layer over the silicide layer;
   removing a portion of the dielectric layer to expose the portion of the silicide layer before removing the portion of the silicide layer; and
   forming a top layer after forming the dielectric layer and removing a portion of the top layer before removing the portion of the dielectric layer, in which the top layer comprises a titanium nitride layer.

2. The method of claim 1, wherein the high region and the low region are formed before the silicide layer is formed and the portion of the silicide layer removed by chemical mechanical polishing is removed from the high region.

3. The method of claim 1, wherein the dielectric layer comprises silicon dioxide.

4. The method of claim 1, wherein the dielectric layer comprises silicon nitride.

5. The method of claim 1, wherein the portion of the dielectric layer is removed by chemical mechanical polishing.

6. The method of claim 1, wherein the portion of the titanium nitride layer is removed by chemical mechanical polishing.

7. The method of claim 1, wherein the portion of the titanium nitride layer is removed with a first slurry and the portion of the dielectric layer is removed with a second slurry.

8. The method of claim 7, wherein a polishing rate of the titanium nitride layer with the first slurry is greater than a polishing rate of the dielectric layer with the second slurry.

9. The method of claim 7, wherein a polishing rate of the titanium nitride layer with the first slurry is less than a polishing rate of the dielectric layer with the second slurry.

* * * * *